United States Patent
Nemati Anaraki et al.

(10) Patent No.: US 9,007,854 B1
(45) Date of Patent: Apr. 14, 2015

(54) METHOD AND SYSTEM FOR OPTIMIZED SOFT DECODING IN A DATA STORAGE DEVICE

(71) Applicant: Western Digital Technologies, Inc., Irvine, CA (US)

(72) Inventors: Majid Nemati Anaraki, Irvine, CA (US); Aldo G. Cometti, San Diego, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/100,404

(22) Filed: Dec. 9, 2013

(51) Int. Cl.
*G11C 7/00* (2006.01)

(52) U.S. Cl.
CPC ........................................ *G11C 7/00* (2013.01)

(58) Field of Classification Search
USPC ............................ 365/189.15, 185.09, 230.06
See application file for complete search history.

(56) References Cited

U.S. PATENT DOCUMENTS

| | | | |
|---|---|---|---|
| 5,299,162 A | 3/1994 | Kim et al. |
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,558,109 B2 | 7/2009 | Brandman et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,805,663 B2 | 9/2010 | Brandman et al. |
| 7,898,855 B2 | 3/2011 | Merry, Jr. et al. |
| 7,904,793 B2 | 3/2011 | Mokhlesi et al. |
| 7,911,836 B2 | 3/2011 | Zilberman |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,132,045 B2 | 3/2012 | Avila et al. |

(Continued)

OTHER PUBLICATIONS

Guangming Lu, U.S. Appl. No. 13/797,923, filed Mar. 12, 2013, 37 pages.

(Continued)

*Primary Examiner* — David Lam

(57) ABSTRACT

Systems and methods are disclosed for decoding solid-state memory cells. In certain embodiments, a data storage device includes a controller configured to decode a non-volatile memory array by performing a first read of a plurality of code words from the non-volatile memory array using a first reference voltage level and performing a second read of the plurality of code words using a second reference voltage level on a first side of the first reference voltage level. The controller is further configured to generate a soft-decision input value associated with a first code word of the plurality of code words based on the first and second reads and decode the first code word using the soft-decision input value.

22 Claims, 15 Drawing Sheets

(56) References Cited

U.S. PATENT DOCUMENTS

| | | | |
|---|---|---|---|
| 8,135,903 B1 | 3/2012 | Kan | |
| 8,151,020 B2 | 4/2012 | Merry, Jr. et al. | |
| 8,156,398 B2 | 4/2012 | Sommer | |
| 8,156,403 B2 | 4/2012 | Shalvi et al. | |
| 8,161,227 B1 | 4/2012 | Diggs et al. | |
| 8,166,245 B2 | 4/2012 | Diggs et al. | |
| 8,243,514 B2 | 8/2012 | Kang et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,547,743 B2 | 10/2013 | Ulriksson et al. | |
| 8,549,236 B2 | 10/2013 | Diggs et al. | |
| 8,549,382 B2 | 10/2013 | Motwani | |
| 8,560,901 B2 | 10/2013 | Seol et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,705,279 B2 * | 4/2014 | Kim | 365/185.09 |
| 8,706,985 B1 | 4/2014 | Boyle et al. | |
| 8,707,104 B1 | 4/2014 | Jean | |
| 8,745,277 B2 | 6/2014 | Kan | |
| 2010/0174849 A1 | 7/2010 | Walston et al. | |
| 2010/0250793 A1 | 9/2010 | Syu | |
| 2011/0099323 A1 | 4/2011 | Syu | |
| 2011/0191652 A1 | 8/2011 | Dave et al. | |
| 2011/0283049 A1 | 11/2011 | Kang et al. | |
| 2012/0063227 A1 | 3/2012 | Weingarten et al. | |
| 2012/0236638 A1 | 9/2012 | Weingarten et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0163328 A1 | 6/2013 | Karakulak et al. | |
| 2013/0290793 A1 | 10/2013 | Booth et al. | |
| 2014/0059405 A1 | 2/2014 | Syu et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |

OTHER PUBLICATIONS

Majid Nemati Anaraki, et al. U.S. Appl. No. 14/100,435, filed Nov. 13, 2013, 36 pages.

Guangming Lu, et al. U.S. Appl. No. 13/842,771, filed Mar. 15, 2013, 40 pages.

J. Wang, T. Courtade, H. Shankar and R.D. Wese, "Soft information for LDPC in flash: Mutual information optimized quantization", In Proc. of IEEE Global Telecommunications Conference (GLOBECOM), Dec. 2011, pp. 1-6.

J. Kim, W. Sung, "Low-energy error correction of NAND flash memory through soft-decision decoding", EURASIP Journal on advances in Signal Processing, 2012:195.

* cited by examiner

METHOD AND SYSTEM FOR OPTIMIZED SOFT DECODING IN A DATA STORAGE DEVICE

BACKGROUND

1. Field

This disclosure relates to data storage systems. More particularly, the disclosure relates to systems and methods for decoding solid-state memory cells.

2. Description of Related Art

Certain solid-state memory devices, such as flash drives, store information in an array of memory cells constructed with floating gate transistors. Decoding such memory cells may involve reading the charge levels of the cells using one or more voltage threshold levels.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
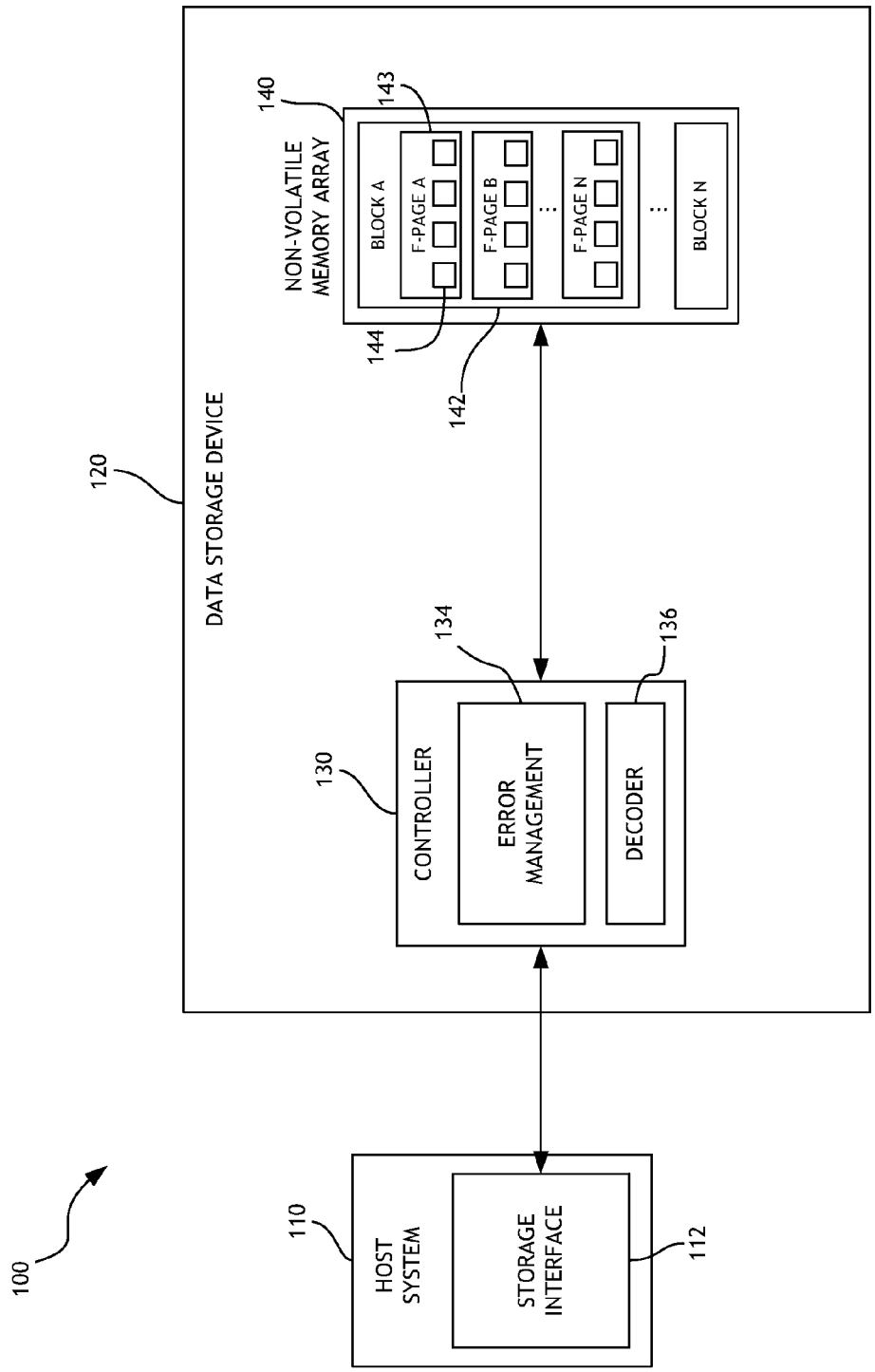
FIG. 1 is a block diagram of a data storage device according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

The present disclosure provides systems and methods for decoding data in a solid-state memory device. In certain embodiments, solid-state memory may be decoded using soft-decision decoding. Soft-decision decoding may be desirable in order to utilize the capabilities of certain relatively-powerful error correction codes (ECCs) used in solid-state memory (e.g., flash memory), such as low-density parity check (LDPC) codes. Soft-decision decoding can provide improved decoding capacity/capability when compared to traditional algebraic codes (e.g., BCH) in certain embodiments.

In order to generate soft-decision input values (e.g., log likelihood ratios (LLRs)), a solid-state memory controller may perform a plurality of reads of memory cells using a plurality of voltage reference levels. The use of additional reads may provide additional information related to the programming state of the memory cells when compared to hard decoding, which may only utilize input values based on a single read; generally, solid-state memory (e.g., flash memory) reads may provide hard information on the page being read. However, multiple reads can be relatively expensive in terms of performance and/or throughput. Therefore, it may be desirable for a decoding scheme to perform decoding using a minimum number of reads in order to preserve the performance and throughput of system.

In certain systems, after occurrence of a first read decoding failure, second and third reads are performed using fixed step size reference voltages to provide soft information for LDPC. Certain embodiments disclosed herein provide for soft decoding after a second read, wherein the LDPC error correction gain is maximized at each read attempt, so as to minimize the need for extra reads. For example, each read in a multiple-read scheme may be performed using an optimal step size with respect to the first read in order to substantially achieve a best available, or acceptable, gain for that read. In certain embodiments, when hard decode fails, a read retry process may be used to find an optimal read point. If decoding still fails after optimal read point selection, soft decoding may be used, such as erasure decoding, or 3-read soft decoding. By increasing the gain at each read attempt, it may be possible to reduce the number of required reads for a specific cell or group of cells, thereby potentially increasing the throughput and usable endurance of the flash.

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "target page," or variations thereof are used herein according to their broad and ordinary meaning. For example, "page" may refer to a block of a physical memory cells, or to the physical memory cells themselves. Furthermore, within a multi-level cell (MLC), "page" may refer to either of upper or lower pages, which may in turn be associated with most significant bits (MSB), least significant bits (LSB), or other programming mechanism or scheme.

Although the terms "optimal," "optimized," "maximized," "maximum," "minimized," "minimum," and the like may be used in reference to certain features or embodiments disclosed herein, such terms are not necessarily used herein as superlatives, and may simply be used to provide comparative modification, such as indicating an increase, decrease, improvement, reduction, or other lesser degree of the given descriptor.

Data Storage Device

FIG. 1 is a block diagram illustrating an embodiment of a combination of a host system 110 with a data storage device 120 incorporating error management functionality in accordance with embodiments disclosed herein. As shown, the data storage device 120 (e.g., hybrid hard drive, solid-state drive, any storage device utilizing solid-state memory, etc.) includes a controller 130 configured to receive data commands and to execute such commands in the non-volatile memory array 140. Such commands may include data read/write commands, and the like. The controller 130 may be configured to receive data commands from a storage interface (e.g., a device driver) 112 residing on the host system 110. Data commands may specify a block address in the data storage device 120; data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the data storage device. For example, mapping table data may be stored in non-volatile memory array 140 in order to allow for recreation of mapping tables following a power cycle.

In certain embodiments, the non-volatile memory array 140 comprises one or more blocks of storage, identified as Block "A" 142 through Block "N." Each block may comprise a plurality of flash pages (F-pages). For example, Block A 142 of FIG. 1 includes a plurality of F-pages, identified as F-pages "A" 153, B, through "N." In some embodiments, each F-page is a smallest grouping of memory cells in the non-volatile memory array 140 that can be programmed in a single operation or as a unit. Further, each F-page may include a plurality of code words, such as error-correcting pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages. The structure and configuration of the memory array 140 according to some embodiments is described in greater detail below in connection with FIGS. 4A-C.

The controller 130 includes an error management module 134 configured to manage errors associated with data reads from the non-volatile memory array 140. For example, the error management module may operate in connection with a decoder engine 136 to read and interpret data stored on the non-volatile memory array. The controller 130 may be configured to perform error correction according to any desirable method or combination of methods, such as forward-error correction (FEC) methods, including Bose-Chaudhuri-Hocquenghem (BCH) and Reed-Solomon (RS), which may utilize primarily hard-decision input. Alternatively, the controller may utilize low-density parity-check (LCPC) decoding, which can utilize soft-decision input, wherein reads of data from the non-volatile memory array 140 include multiple-bit reliability information.

In certain embodiments, the non-volatile memory array 140 is a solid-state memory array (e.g., flash memory), wherein memory cells store charge in transistor devices, such as floating-gate transistors. The cells of the memory array 140 may be programmed according to a single-level cell (SLC), multi-level cell (MLC), or other programming scheme. Certain embodiments are described herein in the context of an MLC programming scheme, in which a single cell is configured to store two-bits of data.

Figure 2:
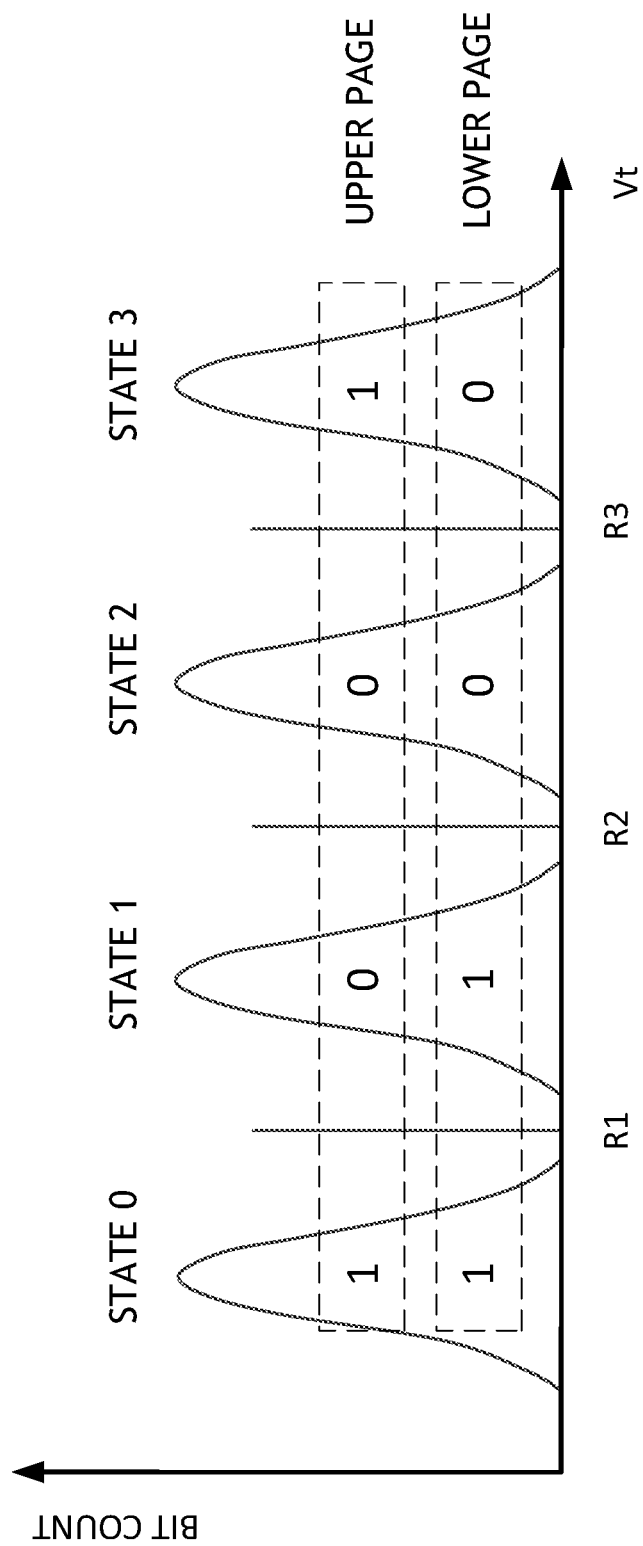
FIG. 2 is a graph showing a probability distribution of cells in a solid-state memory device according to an embodiment.

FIG. 2 is a graph showing a probability distribution of cells in an (MLC) solid-state memory array according to an embodiment. In two-bit MLC solid-state memory, memory cells may be programmed to one of four voltage states. For example, a first state (e.g., an erase state) may correspond to a two-bit value of "11." Higher voltage states may correspond to values of "01," "00," and "10," respectively, for example. As described herein, a most significant bit (MSB) of a two-bit programming state may represent an "upper page" of data, while a least significant bit (LSB) may represent a "lower page," or vice versa.

Generally speaking, certain solid-state memory may provide hard-decision data output based on a reading of the voltage stored in memory cells. For example, the three sensing reference voltages (R1, R2, and R3) may be utilized to fully resolve the four voltage state distribution shown. For example, R1 may be utilized to resolve the boundary between symbols '11' and '01'; while R2 resolves the boundary of symbols '01' and '00' and R3 resolves the boundary for symbols '00' and '10': In certain embodiments, R1 and R3 are required to read upper pages, while only R2 is required for lower pages.

The gap between voltage distribution states, in which the read voltage references may advantageously be positioned in certain embodiments, is referred to as the "read margin." Over time, and as a result of various physical conditions and wear, for example from being subjected to repeated P/E cycles, the read margins between distribution levels may be reduced, resulting in endurance and/or data retention issues. Such reduction in read margin may be due to a number of factors, such as loss of charge due to flash cell oxide degradation, over-programming caused by erratic program steps, programming of adjacent erased cells due to heavy reads or writes in the locality of the cell (or write disturbs), and/or other factors.

Figure 3A:
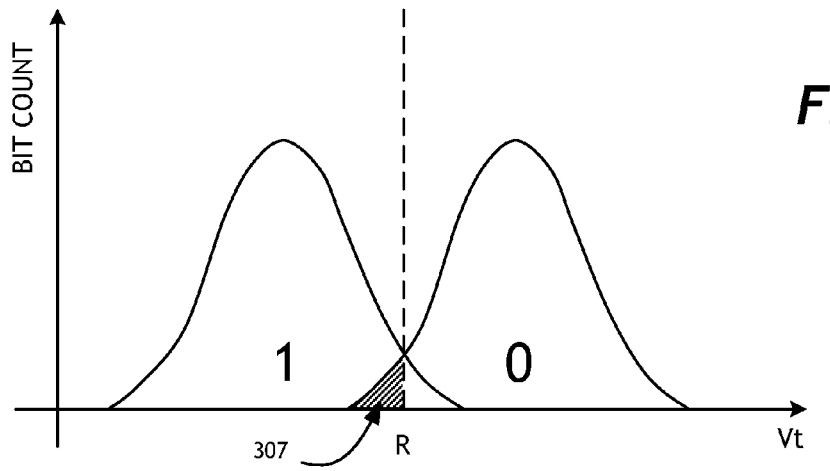
FIG. 3A illustrates a probability distribution showing single reference read level for memory cells in a solid-state memory device according to an embodiment.

FIG. 3A illustrates an example voltage distribution including overlapping distribution states, which may be a result of endurance and/or data retention issues, as described above. While the diagram of FIG. 3A illustrates a two-state distribution, such distribution is provided for the purpose of simplification of description, and embodiments and features disclosed may be applicable to other types of coding schemes, such as MLC programming, as illustrated in FIG. 2. As shown in FIG. 3A, a single read may return incorrect information related to certain memory cells that have migrated across the reference voltage point R due to endurance and/or data retention issues. For example, when reading cells of the '0' state distribution that have migrated to the left of the reference level R, represented by the region 307, such read may incorrectly return a value of '1' for the cell(s). Furthermore, in hard-decoding, fixed reliability information is associated with cell reads. Therefore, additional reliability information may be unavailable which would indicate that the cells in region 307 are in error.

Figure 3B:
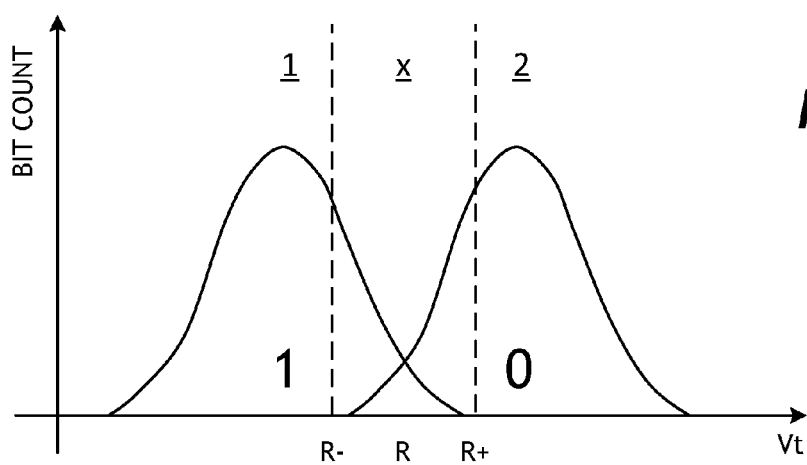
FIG. 3B illustrates a probability distribution showing multiple-read erasure decoding for memory cells in a solid-state memory device according to an embodiment.

Soft-decision input values may be generated in a number of ways. Certain soft-decision solutions provide for additional data based on multiple hard-decision reads at additional reference voltages. In particular, additional reads may be performed to increase resolution in overlapping regions, where a significant portion of bit errors may occur. FIG. 3B illustrates a probability distribution showing multiple-read erasure decoding for memory cells in a solid-state memory device according to an embodiment. In erasure decoding, when a first read is unsuccessful, two additional reads (R−, R+) may be performed on either side of the first read value. The two additional reads may divide the voltage spectrum into three regions, wherein the first read is disregarded such that the three regions correspond to region (1) less than R−, region (x) between R− and R+, and region (2) greater than R+. With respect to the distribution of FIG. 3B, cells falling in the first region may be assigned a value of '1,' and cells falling in the third region may be assigned a value of '0.' The cells falling in the second region, on the other hand, may be characterized as "unknown;" this region may be referred to as the "erasure" region. Soft-decision input values may be derived in some manner from the three states.

Figure 3C:
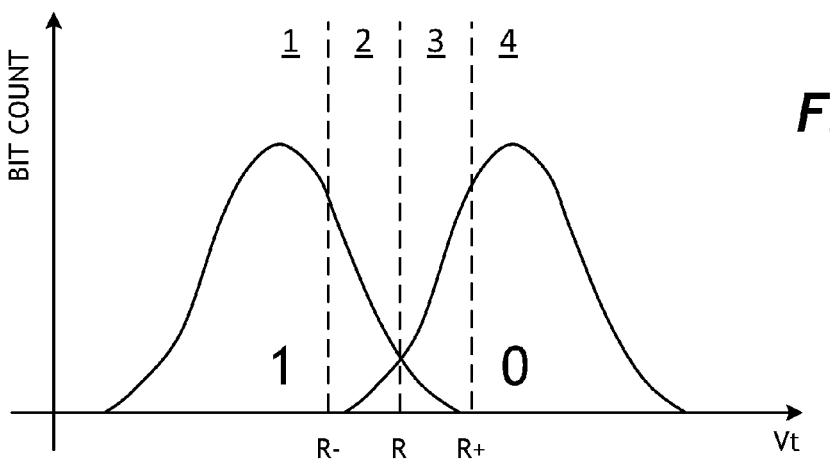
FIG. 3C illustrates a probability distribution showing multiple reference read levels for memory cells in a solid-state memory device according to an embodiment.

The distribution of FIG. 3C shows two additional reads (R−, R+) located on opposite sides of the reference voltage level R. In certain embodiments, three voltage read levels may provide four different regions, e.g., (1) below R−, (2) between R− and R, (3) between R and R+, and (4) above R+. In certain embodiments, the lowest voltage region can be considered a strong '1' symbol, and the next lowest region is a value between '1' and '0.' Reliability incorporated in the multi-bit soft-decision value may reflect the strength of the read. Increasing the number of reads at each symbol boundary can provide more accurate reliability information. However, additional reads can also increase the latency and energy consumption in the memory.

Figure 4:
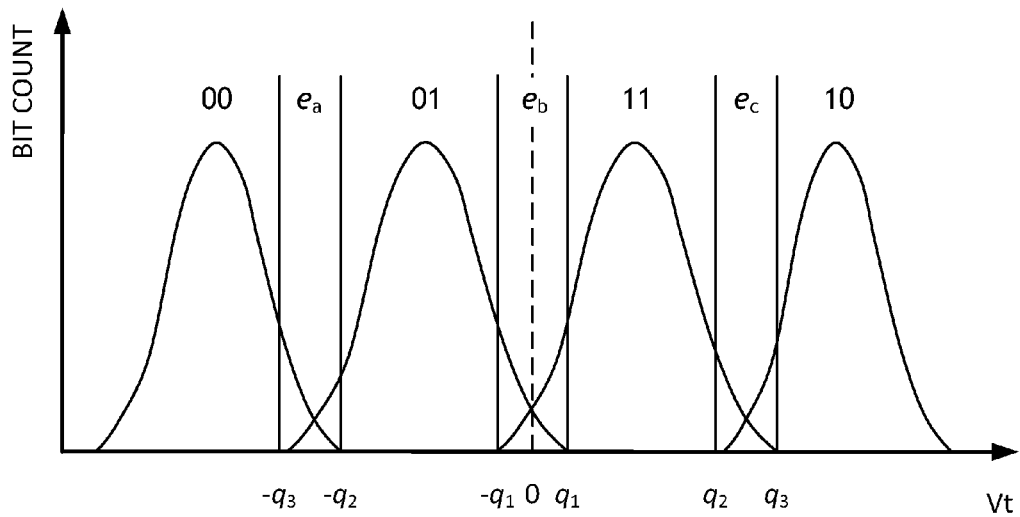
FIG. 4 illustrates a probability distribution showing multiple-read erasure decoding for MLC memory cells in a solid-state memory device according to an embodiment.

FIG. 4 illustrates a probability distribution showing multiple-read erasure decoding for MLC memory cells in a solid-state memory device according to an embodiment. The multiple reads define three erasure regions, $e_a$, $e_b$, $e_c$. In certain embodiments, the location and distance of the reads on either side of a cross-point from the respective distribution cross-points is substantially optimized. For erasure decoding implementations, it may be desirable to either select optimal two-read erasure decoding levels without performing a first read between the two erasure levels, or select such levels after performance of a first read, and subsequent decoding failure (e.g., hard decoding). In certain embodiments, information received using the first read is not used for erasure decoding, and two extra reads in pre-determined locations are performed.

Figure 5:
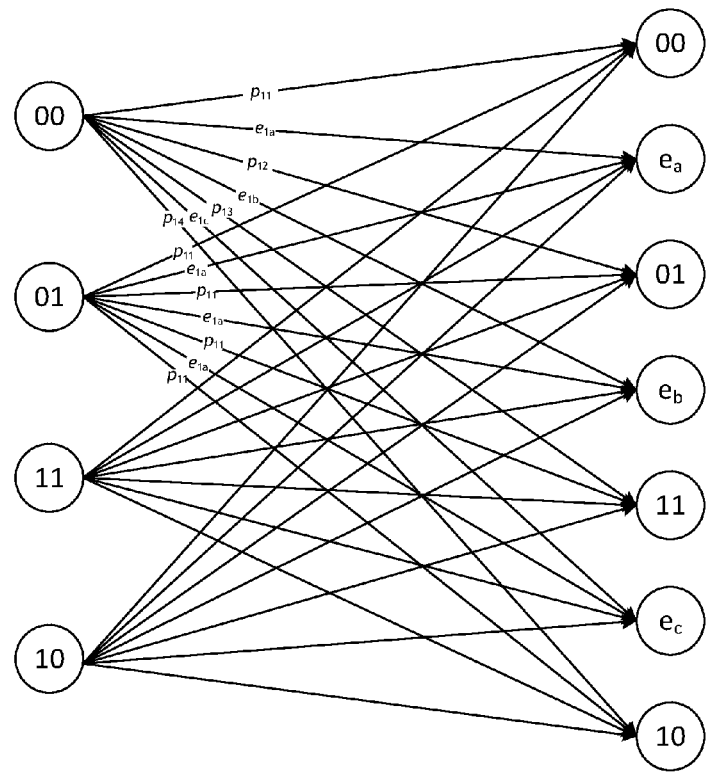
FIG. 5 provides a probability diagram for programming state transitions in the multiple-read erasure decoding scheme shown in FIG. 4.

FIG. 5 provides a probability diagram for programming state transitions in the multiple-read erasure decoding scheme shown in FIG. 4. For example, the circle icons on the left of the diagram may correspond to programming states of cells in an MLC device. On the other hand, the circle icons on the right may correspond to voltage states of cells when read out from the device. The arrows connecting the left circles with the right circles, with corresponding probability variables $p_{11}$, $e_{1a}$, $p_{12}$, $e_{1b}$, etc., represent the probability that a cell programmed to a given programming state will be in a particular resulting voltage state when read out at a later time.

Read-by-Read Decoding

Figure 6:
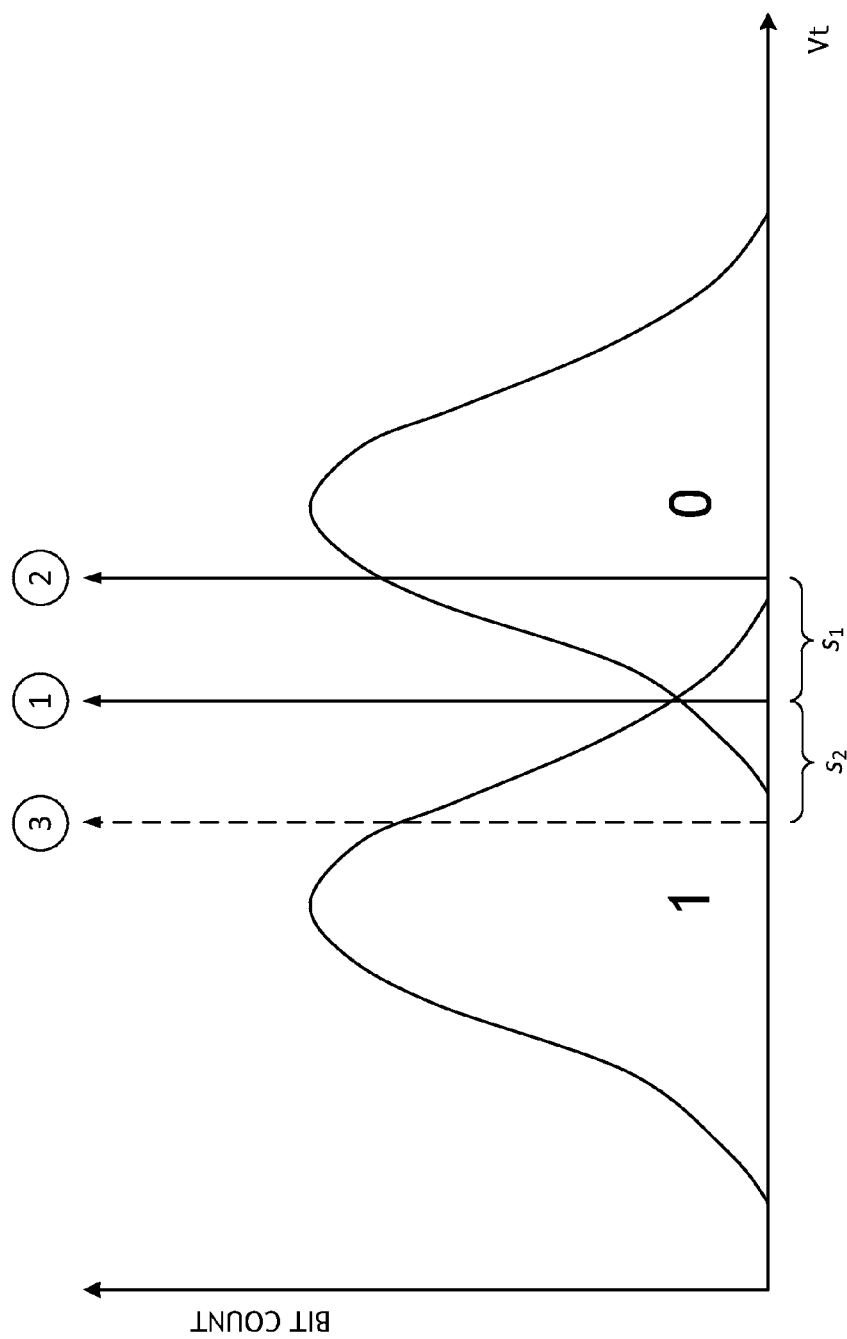
FIG. 6 illustrates a probability distribution for memory cells in a solid-state memory device according to an embodiment.

FIG. 6 illustrates a probability distribution for memory cells in a solid-state memory device according to an embodiment. The distribution of FIG. 6 includes overlapping voltage states in a SLC system. However, the principles disclosed herein may be applicable with respect to voltage state transition regions in MLC or other systems. A first voltage read level is identified in the figure at or near a cross-point between a first state '1' and a second state '0.' The first read voltage level may be selected to optimize decoding gain, such as by using a read retry method, or the like. The first voltage reference level may be used to decode the represented memory cells using hard decoding. If hard decoding is unsuccessful, a second read may be taken at a second voltage point. In certain embodiments, the second read level is used independently of a third read. That is, multiple reads may be used on a read-by-read basis, wherein after each read, decoding is attempted to determine whether one or more additional reads are prescribed or required. Therefore, with respect to FIG. 6, in an embodiment, a read is performed at a first read level and data generated from the read is used to decode the cells. Upon decoding failure, a second read may be taken, after which decoding is performed. A third read may only be relied upon in the event that the second read does not provide sufficient data for successful decoding.

In certain embodiments, all or some read locations are selected to provide improved performance for each specific read. For example, every read reference level may be determined in a way to maximize the attainable gain, or decoding capability, given the previous read locations. In certain embodiments, rather than disregarding the first read, as is done in some erasure decoding methods, the first read information may be utilized in combination with the second read information to generate soft decoding input values. In certain embodiments, after a first hard decoding failure, subsequent decoding operations involve soft decoding, which will provide larger gain with respect to erasure decoding. Therefore, at each step, the gain may be maximized and the probability that additional reads will be required may be reduced.

In certain embodiments, the first read is set at a best estimated location (e.g., a location selected to maximize hard decoding gain). After decoding, the number of 1-to-0 and 0-to-1 bit flips may indicate whether the first read was in optimal position or not. The second read may then be made at an optimally-selected step size from the first read ($s_1$) to maximize the overall gain of soft decoding. In addition, if a third read is necessary, the read may be done on an opposite side of the first read as the second read, and an optimal step size $s_2$ from the first read.

Step Size/Direction Optimization

Figure 7:
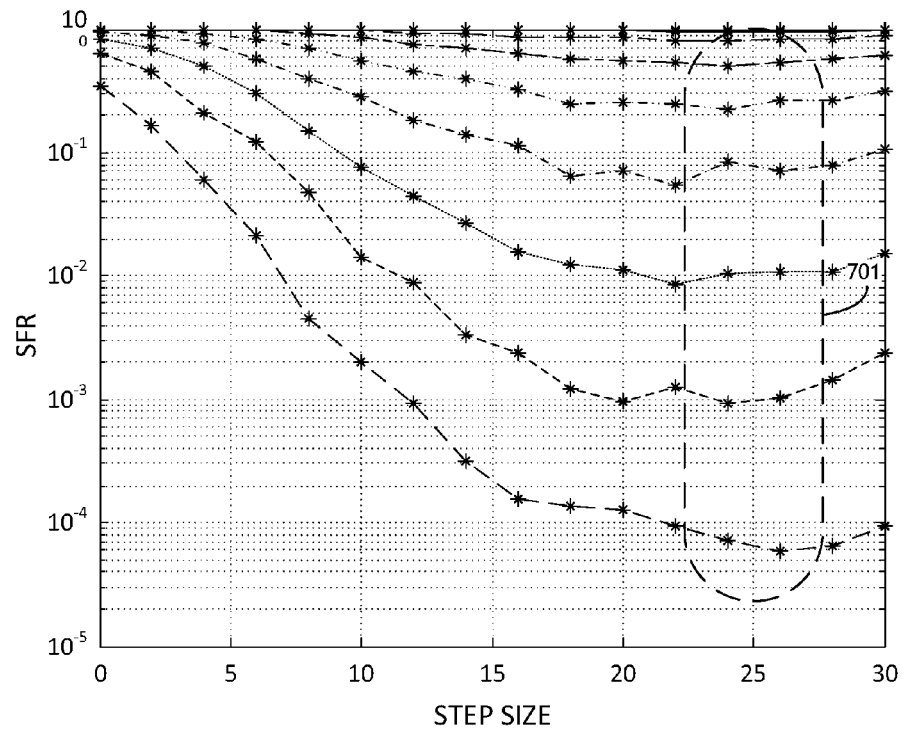
FIG. 7 is a graph showing possible decoding performance using various voltage read step sizes according to an embodiment.

Certain multiple-read solutions use an even number of additional reads positioned at fixed step sizes from the first read. However, certain embodiments disclosed herein provide for optimal step size selection for additional reads. FIG. 7 is a graph showing possible decoding performance using various voltage read step sizes according to an embodiment. In certain embodiments, step sizes are selected based on information such as that represented by the graph of FIG. 7. As shown, the data of FIG. 7 may illustrate optimal step sizes, for example, at or about the region 701, wherein the x-axis represents voltage range between successive reads and the y-axis represents sector frame error rate (SFR) at the various step sizes. The various curves of the graph may represent different signal-to-noise ratio (SNR) values. Therefore, the graph shows the change of gain at each SNR when step size is modified. The illustrated optimum step size may correspond to an optimum step size for a second read, relative to a first read.

Figure 8:
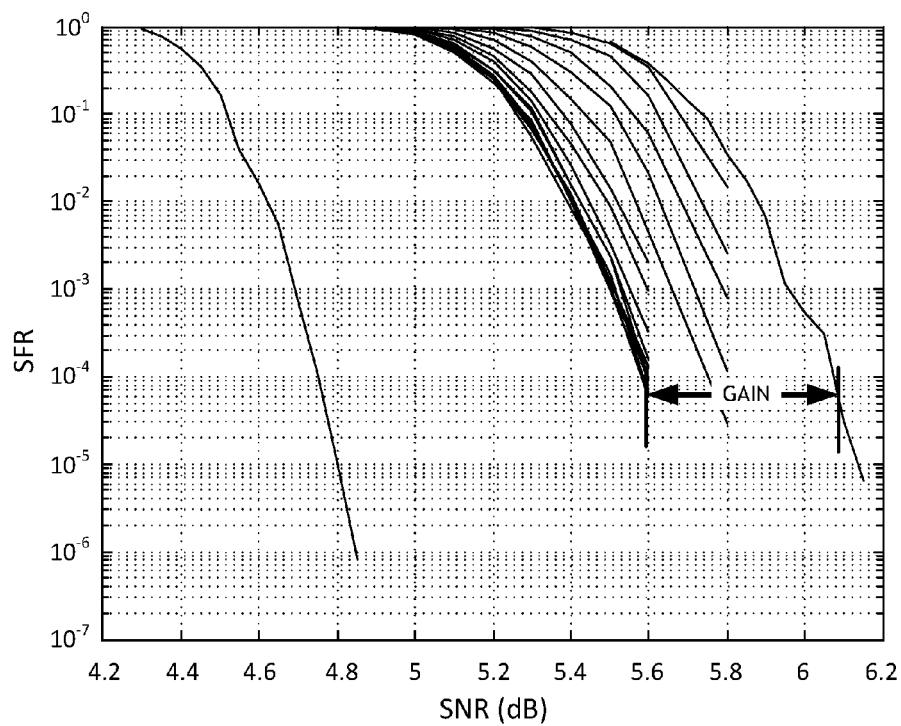
FIG. 8 is a graph showing possible decoding performance using optimized voltage read step size according to an embodiment.

FIG. 8 is a graph showing possible decoding performance using optimized voltage read step size according to an embodiment. The various curves of the graph may represent different step sizes or read positions. The graph may represent LDPC decoder gain. The gain for optimized second read step size selection relative to hard decoding is shown in the figure. In certain embodiments, a table of data may be maintained including optimum step size information, wherein the controller 130 may query the table using one or more parameters, such as code rate, SNR, or the like.

While certain embodiments are disclosed herein in the context of second read step size optimization, the described principles may be applicable to third reads, or subsequent reads. As demonstrated in FIGS. 7 and 8, the choice of read step size in multiple read schemes can change the overall error correction capability of a data storage system. With non-optimum choice of step size, a higher number of reads may be necessary to achieve the same gain achievable with fewer reads at intelligently-selected step sizes, which can affect performance negatively.

Figure 9:
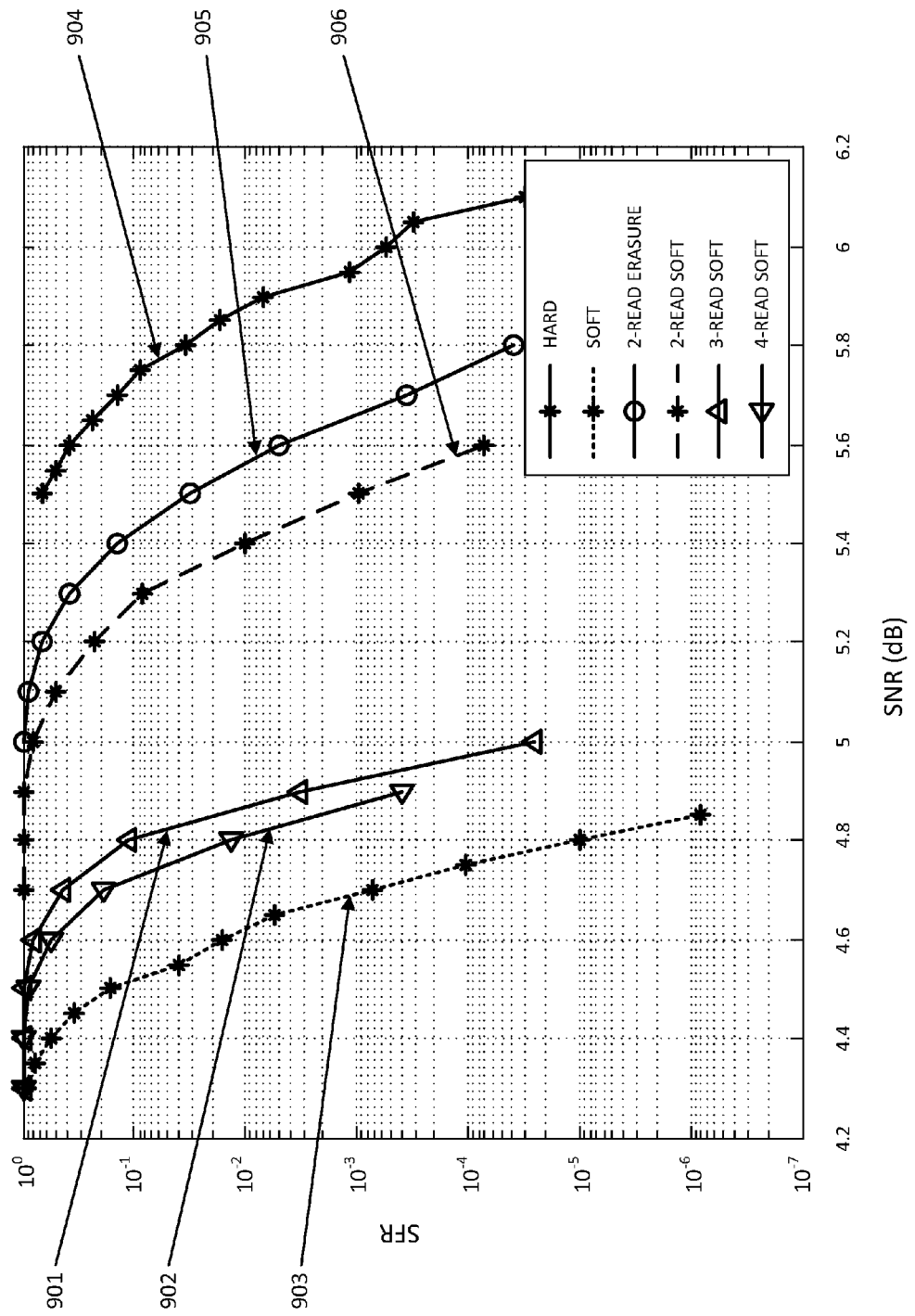
FIG. 9 is a graph showing possible decoding performance for various hard and soft decoding schemes according to an embodiment.

FIG. 9 is a graph showing possible decoding performance for various hard and soft decoding schemes according to an embodiment. The graph includes curves representing the following decoding schemes: (903) soft decoding with optimal read position; (902) four-read soft decoding using an optimally-selected first read; (901) three-read soft decoding using an optimally-selected first read; (906) two-read soft decoding using an optimally-selected first read; (905) two-read erasure decoding using an optimally-selected first read; and (904) hard decoding with optimally-selected read position.

The graph of FIG. 9 shows the relative gain of hard and soft decoding with different numbers of reads. As shown, while erasure decoding (with optimal second read step size) can provide a substantial gain, two-read soft decoding (with optimal read location) can provide even larger gain in some embodiments. With three and four reads using optimal step size, the ECC correction capability may become substantially close to full soft decoding. Therefore, in certain embodiments, a coding gain substantially close to full soft decoding may be obtained using a reduced number of reads.

In certain cases, the first read try may be offset from the optimal read location, such that the resulting ECC hard decode correction capability may not be as expected. Therefore, error correction of some code words (E-pages) may fail that would otherwise have successfully been decoded. Some methods of modifying the first read reference level to correct read level offset may involve performing read re-tries. In certain read re-try processes, the reference read level may be modified, after which the data is read from the flash again and the new data is hard decoded. The process may be performed multiple times, such that ultimately either the E-page passes correction, or the process moves on to soft decoding.

Figure 10:
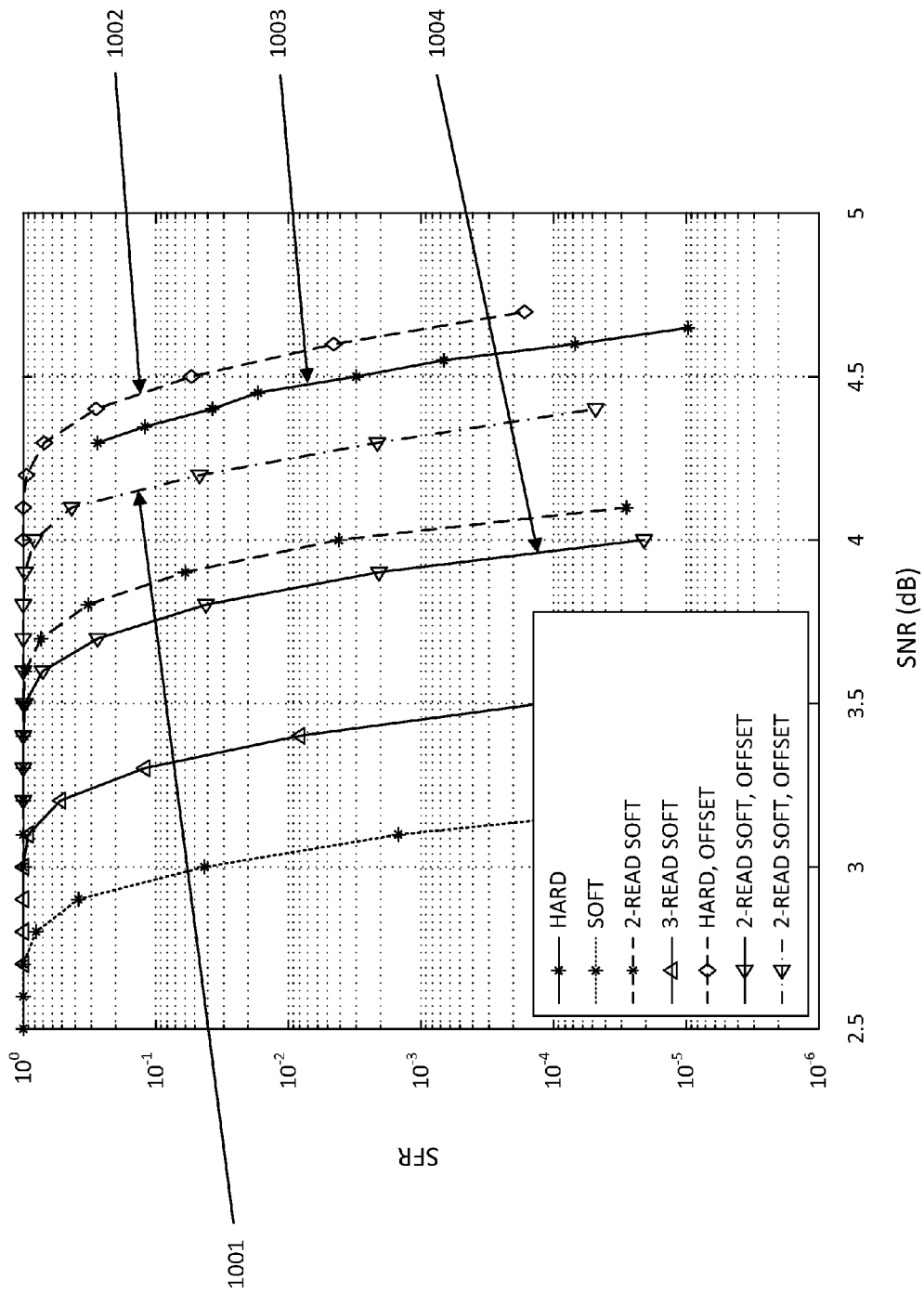
FIG. 10 is a graph showing possible decoding performance for various hard and soft decoding schemes according to an embodiment.

In LDPC applications, because LDPC can have soft-decoding capability, read re-tries with hard decoding may take up substantial amounts of available resources (e.g., power, performance, etc.), without providing the most efficient gain. This effect can be seen in connection with FIG. 10. FIG. 10 is a graph showing possible decoding performance for various hard and soft decoding schemes according to an embodiment. The graph of FIG. 10 includes curves corresponding to the following decoding schemes: (1001) soft-decoding with offset first read and incorrect direction of second read; (1002) hard-decoding with offset first read position; (1003) hard decoding with optimal first read position; and (1004) soft-decoding with offset first read and correct second read direction.

When the first read is offset from the optimal location, correction capability may follow the curve 1002, rather than the curve 1003. Using read re-try, the curve 1003 may represent a best possible performance for a subsequent hard decoding. However, if the second read is performed in the correct direction (e.g., left/right of the first read), and in optimum step size from the first read, the resulted correction capability may substantially follow the curve 1004, which may provide, for example, more than 0.7 dB gain with respect to the first read. In a situation where, for some reason, the second read direction is chosen wrong, embodiments disclosed herein for second-read decoding (e.g., curve 1004) may still provide improved performance than may be achieved with second read re-try when the second read is selected in an optimal position (e.g., curve 1003).

In certain embodiments, two-read soft decode with optimal first read location (curve 906) can provide a correction gain. If the first read is not in the optimum location, certain embodiments disclosed herein may provide even larger gain, compensating partly for the lost gain in the first (non-optimum) read location. In certain embodiments, for a particular programming code rate, a gain of approximately 0.7 dB may be achieved. Such a gain may decrease the likelihood that additional reads will be required, thereby helping to maintain high performance and/or low power requirements.

Figure 11:
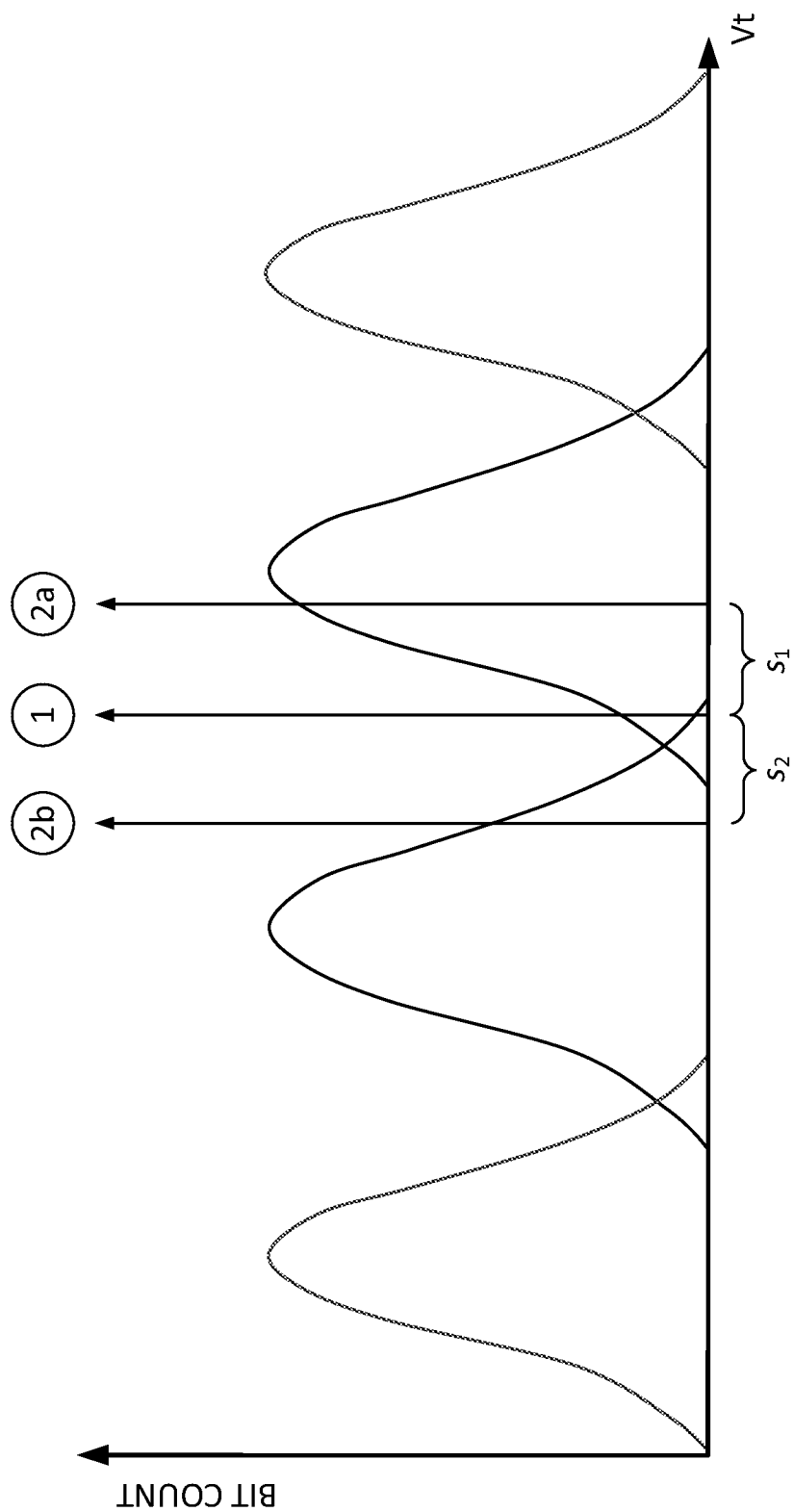
FIG. 11 illustrates a probability distribution for memory cells in a solid-state memory device according to an embodiment FIG. 12 provides a flow diagram for a process for decoding memory cells in a solid-state memory device according to an embodiment.

In certain embodiments, when a first read is in optimal position and the relevant voltage state distributions are substantially symmetric, the second read may provide similar result whether on the right side or left side of the first read. When the first read level is not in the optimum position, the optimum read step size in the correct direction may help to obtain even the lost gain in the first read. FIG. 11 illustrates a probability distribution for memory cells in a solid-state memory device according to an embodiment, wherein a first read is offset from an optimal position. Specifically, the first read is positioned to the right of the optimal position. The distribution of FIG. 11 includes a possible second read location (2a) in a sub-optimal direction, that is, away from the optimal first read position. The distribution further illustrates a possible second read location (2b) in an optimal direction from the first read. In certain embodiments, $s_1$ and $s_2$ represent pre-defined optimum step sizes for each direction.

Figure 12:
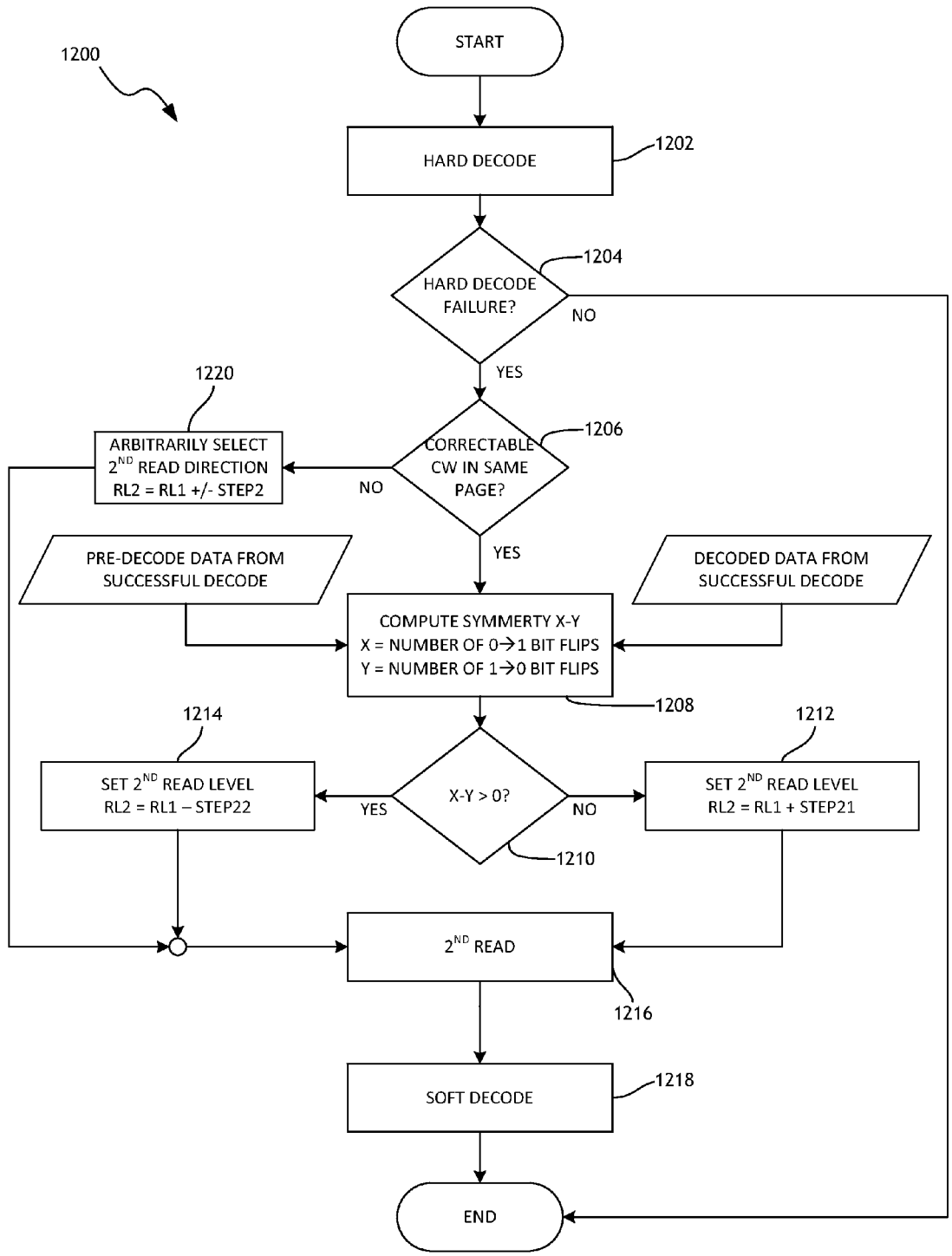

FIG. 12 provides a flow diagram for a process 1200 for decoding memory cells in a solid-state memory device according to an embodiment. In one embodiment, the process 1200 is performed at least partially by the controller 130, error management module 134 and/or decoder 136 described above in connection with FIG. 1. The process 1200 involves performing a hard decode of solid-state memory cells at block 1202. If it is determined that the hard decode fails with respect to one or more cells at block 1204, the process 1200 may involve determining whether one or more correctable code words are present in the same page as the failed code word(s) at block 1206. If so, the process 1200 may involve determining flipped-bit count information relating to the successfully decoded code word(s), as shown at block 1208. For example, the bit-count information may be derived based at least in part on pre-decode data from the successfully-decoded code word(s) and decoded data from the successfully-decoded code word(s). If the number of 0-to-1 flips is greater than the number of 1-to-0 flips, then the second read reference level may be set to a first side of the first read, the first side being in the direction of the '1' distribution state (see block 1214). If it is determined that the number of 1-to-0 flips is greater than the number of 0-to-1 flips, then the second read may be positioned on a second side of the first read, the second side being in the direction of the '0' distribution state (see block 1212). The second read position, whether in the first direction or the second direction, may be selected to increase correction gain. At block 1216, the second read is performed.

In certain embodiments, if correctable code words are not available, the process 1200 may involve arbitrarily selecting a direction for the second read. The second read level may then be set to the selected side of the first read and positioned offset from the first read level. The process may then proceed to block 1216 where the second read is performed, after which a soft decoding is performed based at least in part on the second read data.

In certain embodiments, optimal step size determination may be based at least in part on a relevant code rate (e.g., an amount of user data per total data of a data unit, where total data includes user data and parity data), or other coding parameter(s) of the controller. Code rate may be based on selected code word length. Code rates may be maintained in a data table stored in the non-volatile memory array, wherein the table associates code rate values with optimal step size values. Data storage systems may be designed to use a range of code rates. For example, certain embodiments are configured to operate at a code rate of approximately 0.882 (1920 bytes of user data for 2176 bytes of total code length). Various pre-defined code word lengths can be used to accommodate memory arrays of different page sizes.

A controller supporting LDPC coding can code data at different code rates. The controller can, accordingly, gradually increase the amount of parity per unit data from a code rate of, for example, 0.941 to codes rates of 0.926, 0.882, and 0.853, in response to changes in the quality (e.g., loss of quality) of the non-volatile memory array. The controller can adjust the code rate (e.g., an amount of parity per unit data) of memory pages, blocks, or other units of memory as the memory pages, blocks, or other divisions wear out and/or experience decreased quality.

Figure 13:
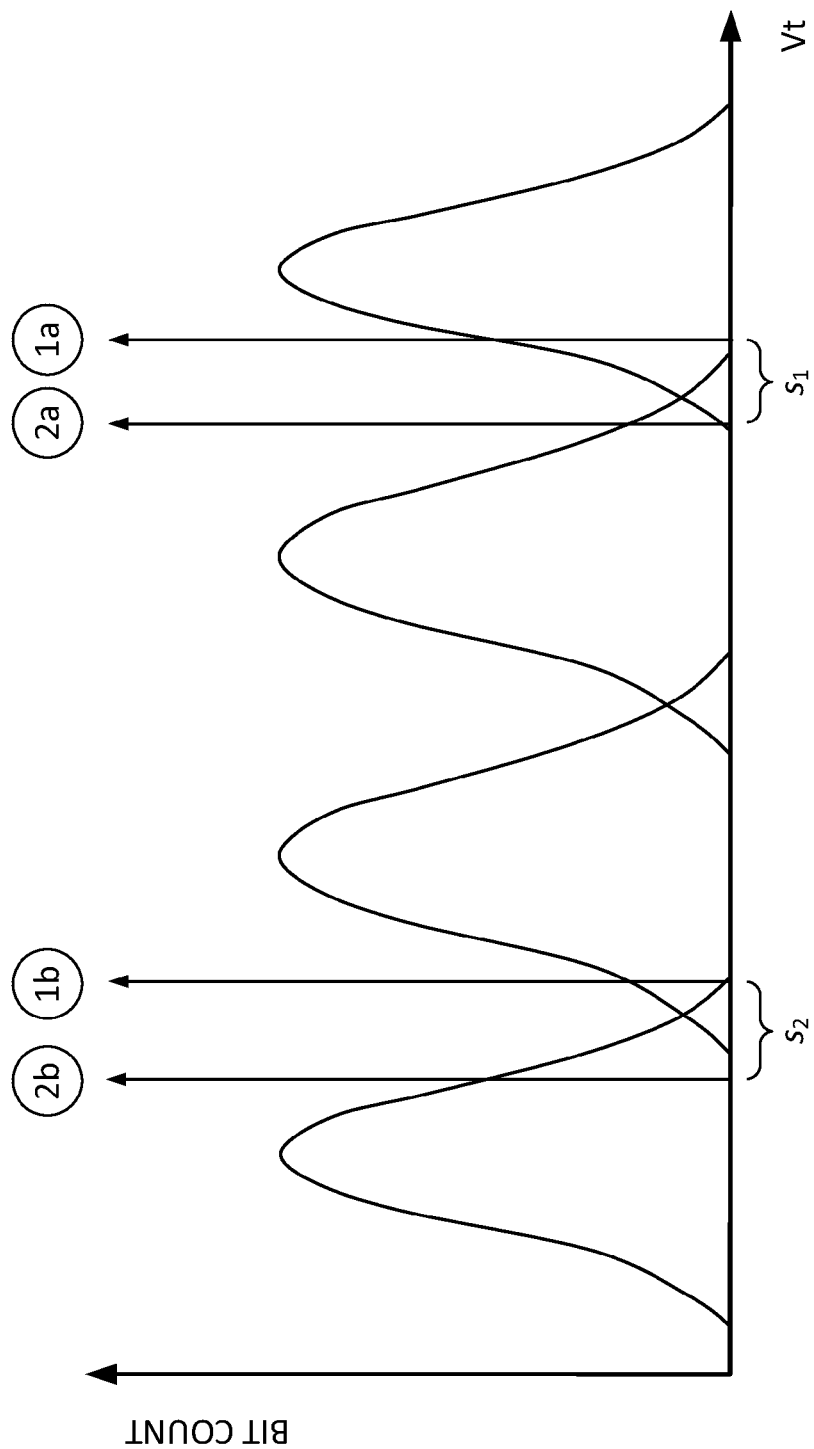
FIG. 13 illustrates a probability distribution for memory cells in a solid-state memory device according to an embodiment FIG. 14 provides a flow diagram for a process for decoding memory cells in a solid-state memory device according to an embodiment.
Figure 14:
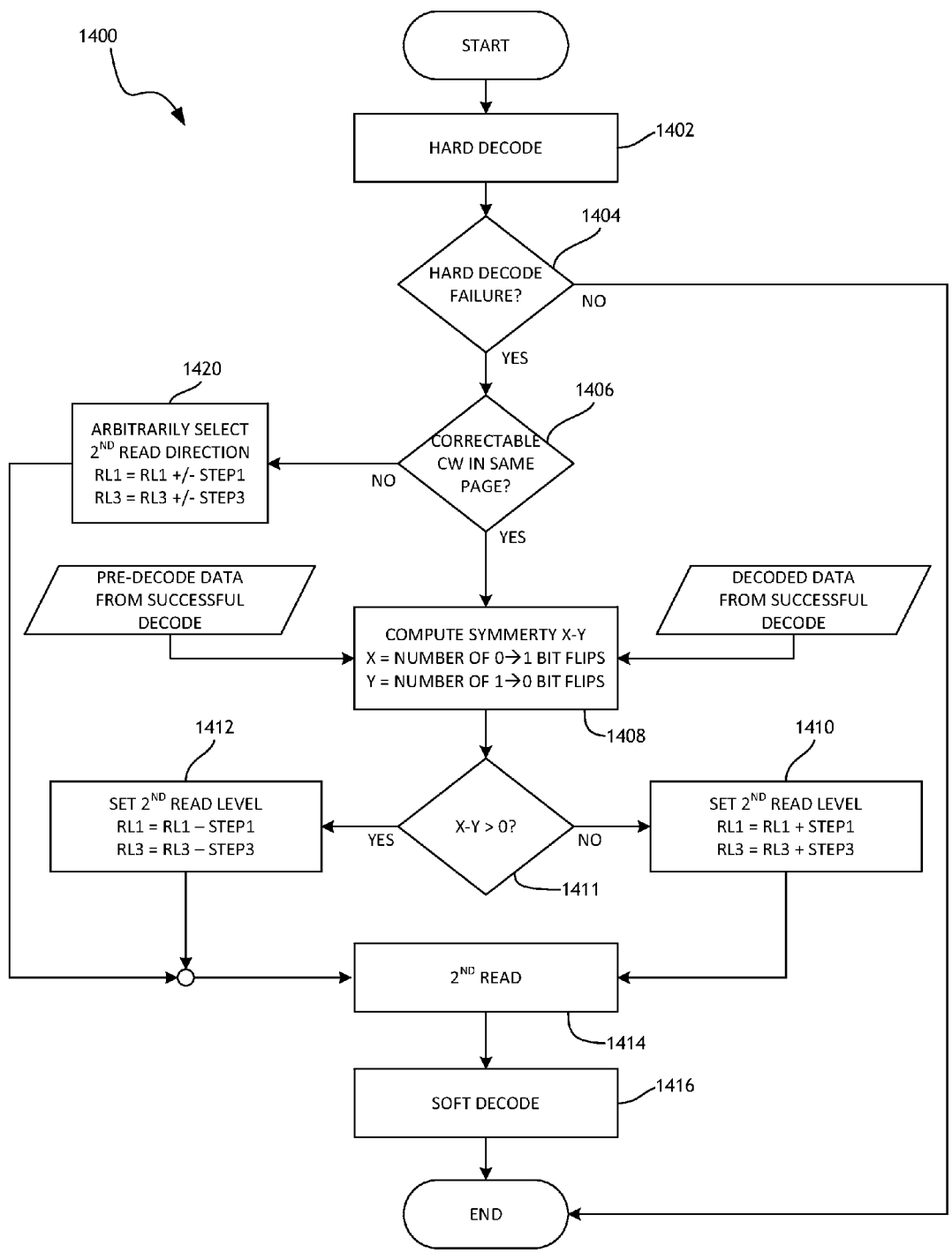

FIG. 13 illustrates a probability distribution for memory cells in a solid-state memory device according to an embodiment. Similarly to embodiments disclosed above for lower page decoding, decoding of upper pages can be performed on a read-by-read basis, wherein reads are intelligently selected to increase correction gain. The diagram of FIG. 13 may be understood in connection with the flow chart illustrated in FIG. 14. FIG. 14 provides a flow diagram for a process for decoding memory cells in a solid-state memory device according to an embodiment. In one embodiment, the process 1400 is performed at least partially by the controller 130, error management module 134 and/or decoder 136 described above in connection with FIG. 1. The process 1400 provides a mechanism for determining the correct direction for a second read for upper page decoding. The process 1400 may involve performing a hard decode on a plurality of cells in a solid-state memory device at block 1402. If hard decoding fails, as determined at block 1404, one or more additional reads may be performed for the purpose of decoding the cells using soft-decision input.

As in low pages, with first read (1a, 1b) in an offset position, the second read (2a, 2b) position may be optimized for soft decoding. The direction for the best results may be obtained from successfully-decoded code words from the same page, as well as and difference between 1-to-0 and 0-to-1 flip counts, as described above. For example, at block 1408 data from a successful decode is used to compute the difference between the number of 1-to-0 bit flips and 0-to-1 bit flips. A second read reference voltage position is determined either at block 1412 or 1410, depending on whether the number of 1-to-0 bit flips or 0-to-1 bit flips is greater.

The step size for each code rate may be pre-determined. In certain embodiments, the step sizes STEP1 AND STEP3 may represent optimum step sizes. As upper page decoding may require reads at read levels R3 and R1 (see FIG. 2), the process 1400 involves setting second read levels for both R1 and R3 regions of the distribution. At block 1414, one or more second reads are performed using the determined reference voltage level(s).

Figure 16:
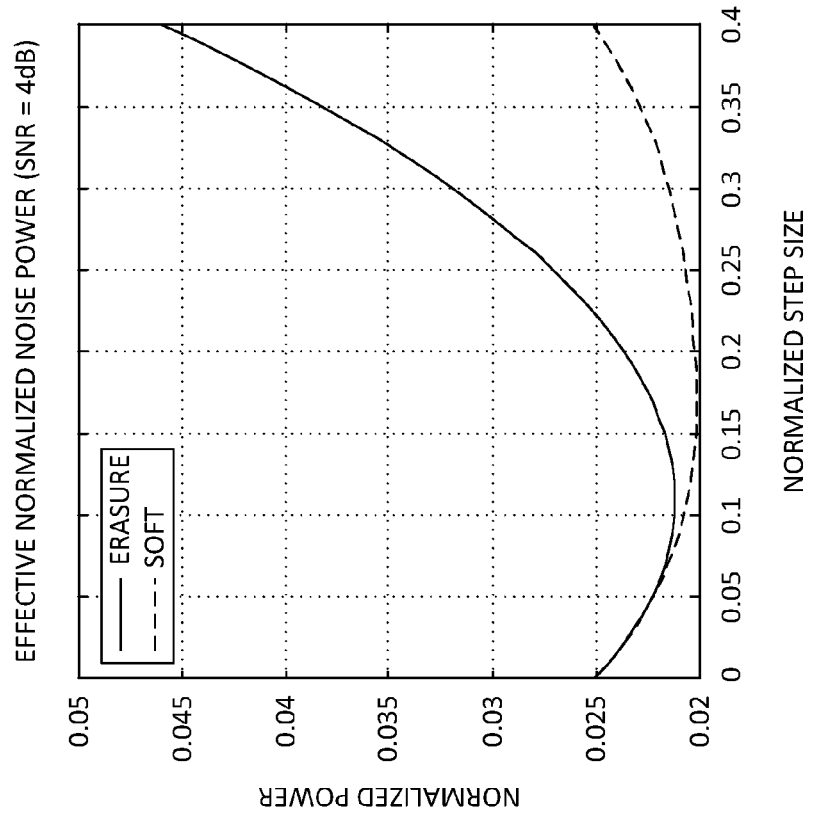
FIGS. 15 and 16 provide graphs showing possible optimal voltage read step sizes according to some embodiments.
Figure 15:
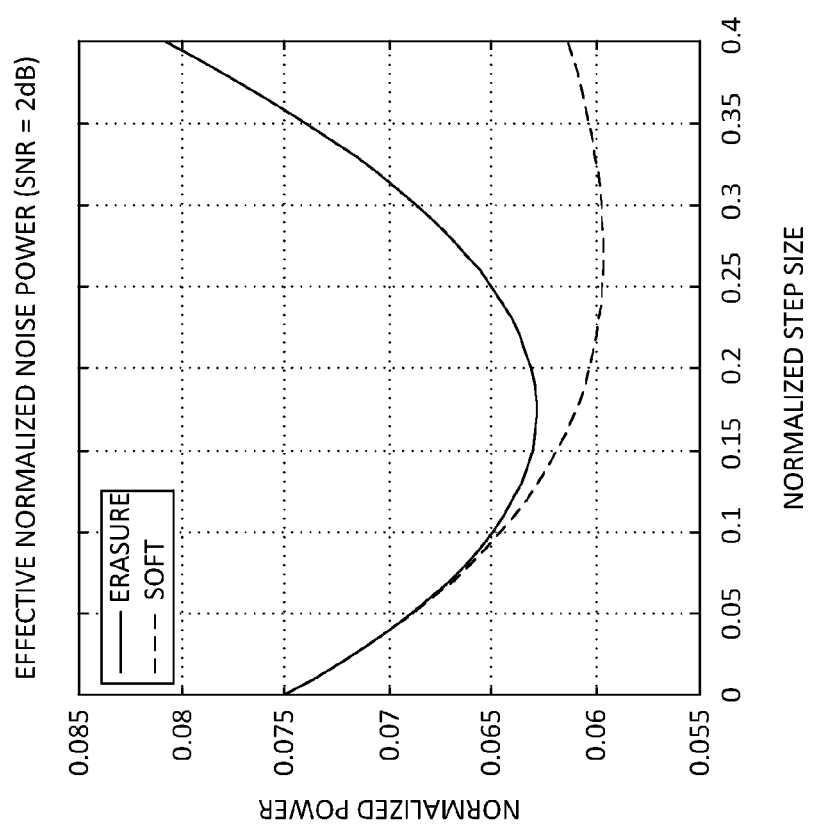

FIGS. 15 and 16 provide graphs showing possible optimal voltage read step sizes according to some embodiments. When a voltage distribution for each voltage programming level is available, it may be possible to calculate optimal step size for different SNR values. Assuming a Gaussian distribution, FIGS. 15 and 16 show possible optimal step sizes for SNR equal to approximately 2 dB and 4 dB, respectively. The graphs show curves for erasure decoding, as well as soft decoding.

Figure 17:
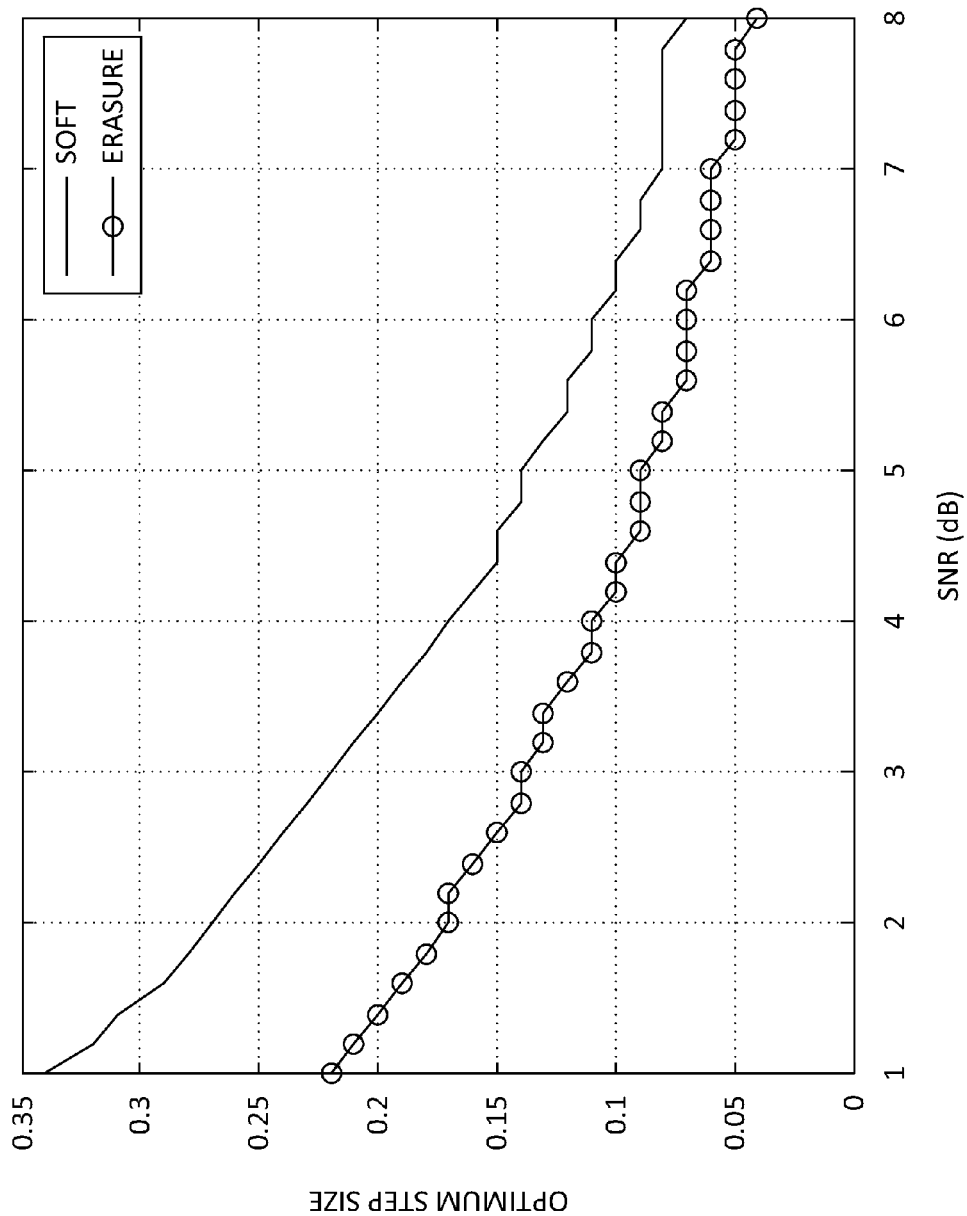
FIG. 17 is a graph illustrating possible optimal voltage read step sizes according to an embodiment.

By repeating the process and optimizing the step size for all interested range of SNRs, the graph of FIG. 17 may be obtained. FIG. 17 is a graph illustrating possible optimal voltage read step sizes according to an embodiment. As it is shown in the figure, optimum step size may be SNR-dependent. However, the range of effective SNR for each code rate may be limited. In a limited range, the relative change of optimal step size may be relatively small. Moreover, for each code rate, the lower SNR region may correspond to the region in which it may be necessary or desirable to perform multiple reads. Therefore, it may be possible to select substantially optimal step size values corresponding to minimum SNR in an applicable SNR region for the particular code rate.

Figure 18:
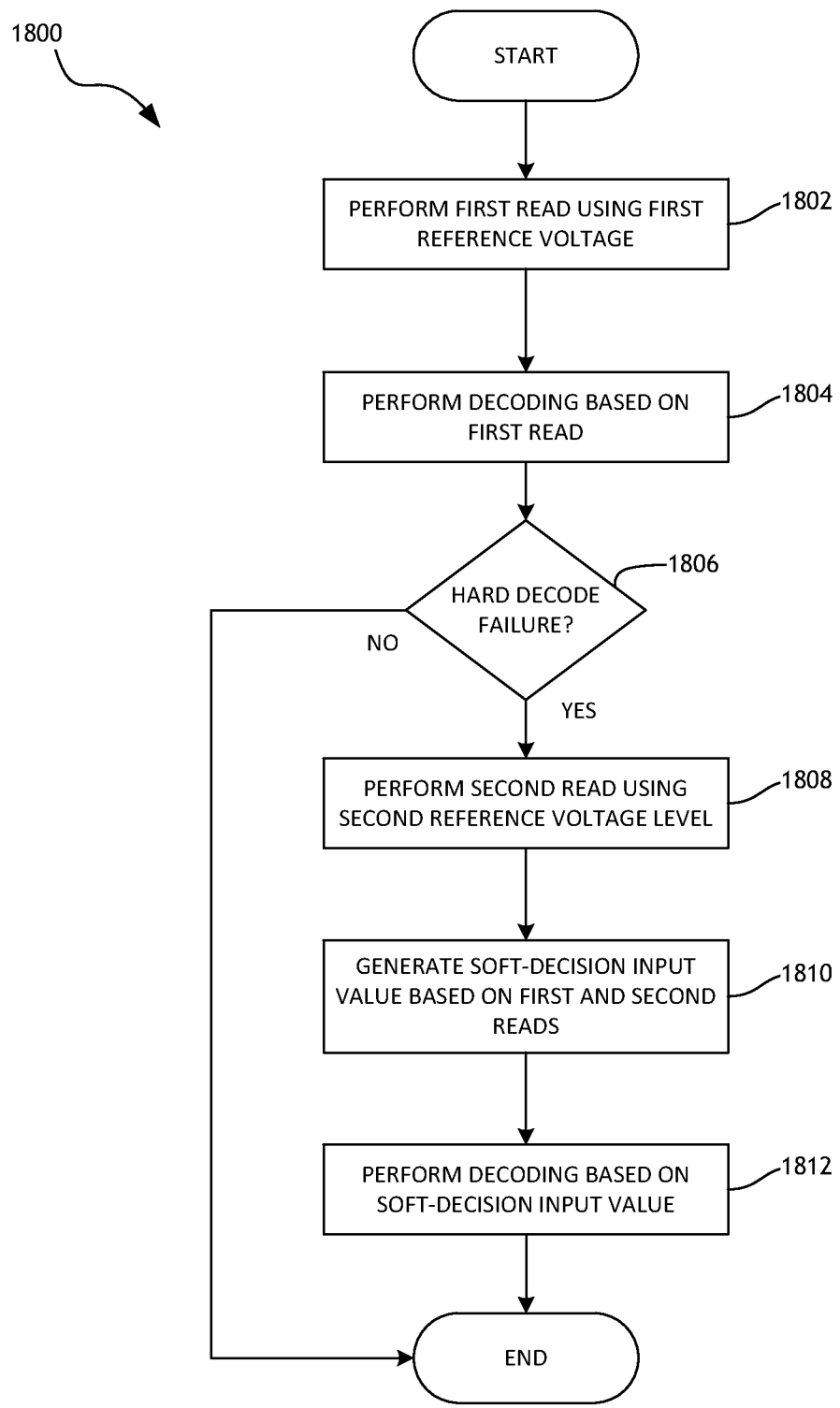
FIG. 18 is a flow diagram for a process for decoding memory cells in a solid-state memory device.

FIG. 18 is a flow diagram for a process 1800 for decoding memory cells in a solid-state memory device. In one embodiment, the process 1800 is performed at least partially by the controller 130, error management module 134 and/or decoder 136 described above in connection with FIG. 1. In certain embodiments, the process 1800 involves performing a read of a plurality of memory cells using a first voltage read level, as illustrated at block 1802. A first decoding, such as a hard decoding, may be performed based at least in part on data returned from the first read. At block 1806, it is determined whether the first decoding was successful. If so, no further decoding operations may be necessary. However, if decoding fails, a second read may be performed at block 1808 using a second reference voltage level. Data from the second read and the first read may be used to generate a soft-decision input value at block 1810, which may be used to perform a soft decoding, as shown at block 1812. If the soft decoding is successful, no further decoding operations may be necessary. In certain embodiments, if soft decoding is unsuccessful, the process 1800 may involve performing one or more additional reads and generating revised soft decision input value(s) for subsequent soft decoding, wherein decoding is performed after each read. In certain embodiments, one or both of the first reference voltage and second reference voltage are selected at optimal, or intelligent, locations in order to improve performance.

Additional Embodiments

Those skilled in the art will appreciate that in some embodiments, other types of data storage systems and/or programming schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
    a non-volatile memory array including a plurality of non-volatile memory elements; and
    a controller configured to:
    perform a first read of a plurality of code words from the non-volatile memory array using a first reference voltage level;
    perform a second read of the plurality of code words using a second reference voltage level on a first side of the first reference voltage level;
    generate a soft-decision input value associated with a first code word of the plurality of code words based on the first and second reads; and
    decode the first code word using the soft-decision input value.

2. The data storage device of claim 1, wherein the controller is further configured to decode the first code word using the soft-decision input value prior to performing additional reads beyond the first and second reads.

3. The data storage device of claim 1, wherein the controller is further configured to select the first voltage reference level to maximize hard decision gain for the plurality of code words.

4. The data storage device of claim 1, wherein the controller is further configured to generate the soft-decision input value using an erasure decoding scheme.

5. The data storage device of claim 1, wherein the controller is further configured to determine the second reference voltage level based at least in part on a data code rate associated with the plurality of code words.

6. The data storage device of claim 5, wherein the controller is configured to:
    maintain a data table associating step sizes between voltage reference levels and data code rates; and
    determine the second reference voltage level at least in part by consulting the data table.

7. The data storage device of claim 1, wherein the controller is further configured to determine whether the first side is an optimal side of the first reference voltage level for the second voltage reference level.

8. The data storage device of claim 7, wherein the controller is further configured to determine whether the first side is an optimal side by determining whether a number of flipped bits from a first voltage state to a second voltage state associated with a successfully-decoded code word is greater when read using the second reference voltage than when read using the first reference voltage.

9. The data storage device of claim 1, wherein the controller is further configured to select the first side at least in part by determining whether a number of bits of one or more successfully decoded code words that have flipped from a first state to a second state is greater than a number of bits of the one or more successfully decoded code words that have flipped from the second state to the first state based on the first read.

10. The data storage device of claim 1, wherein the controller is further configured to perform a third read at a third voltage reference level on a second side of the first reference voltage in response to detecting that the decoding of the first word using the soft decision input value has failed.

11. The data storage device of claim 10, wherein the controller is further configured to:
    generate a new soft-decision input value associated with the first code word based at least in part on the third read; and
    decode the first code word using the new soft-decision input value.

12. A method of decoding data in a data storage system, the method comprising:
    performing a first read of a plurality of code words from a non-volatile memory array using a first reference voltage level;
    performing a second read of the plurality of code words using a second reference voltage level on a first side of the first reference voltage level;
    generating a soft-decision input value associated with a first code word of the plurality of code words based on the first and second reads; and
    decoding the first code word using the soft-decision input value.

13. The method of claim 12, wherein said decoding the first code word using the soft-decision input value is performed prior to performing additional reads beyond the first and second reads.

14. The method of claim 12, further comprising selecting the first voltage reference level to maximize hard decision gain for the plurality of code words.

15. The method of claim 12, wherein said generating the soft-decision input value is performed using an erasure decoding scheme.

16. The method of claim 12, further comprising determining the second reference voltage level based at least in part on a data code rate associated with the plurality of code words.

17. The method of claim 16, further comprising maintaining a data table associating step sizes between voltage reference levels and data code rates, wherein said determining the second reference voltage level comprises consulting the data table.

18. The method of claim 12, further comprising determining whether the first side is an optimal side of the first reference voltage level for the second voltage reference level.

19. The method of claim 18, wherein said determining whether the first side is an optimal side comprises determining whether a number of flipped bits from a first voltage state to a second voltage state associated with a successfully-decoded code word is greater when read using the second reference voltage than when read using the first reference voltage.

20. The method of claim 12, further comprising selecting the first side at least in part by determining whether a number of cells of one or more successfully decoded code words that have flipped from a first state to a second state is greater than a number of cells of the one or more successfully decoded code words that have flipped from the second state to the first state based on the first read.

21. The method of claim 12, further comprising performing a third read at a third voltage reference level on a second side of the first reference voltage in response to detecting that the decoding of the first word using the soft decision input value has failed.

22. The method of claim 21, further comprising:
generating a new soft-decision input value associated with the first code word based at least in part on the third read; and
decoding the first code word using the new soft-decision input value.

* * * * *